United States Patent
Sasaki et al.

(10) Patent No.: US 12,476,079 B2
(45) Date of Patent: Nov. 18, 2025

(54) PLASMA PROCESSING METHOD AND PLASMA PROCESSING APPARATUS

(71) Applicant: Tokyo Electron Limited, Tokyo (JP)

(72) Inventors: Hikoichiro Sasaki, Miyagi (JP); Shirong Guo, Miyagi (JP); Takenobu Ikeda, Miyagi (JP); Yoshimitsu Kon, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 237 days.

(21) Appl. No.: 18/330,501

(22) Filed: Jun. 7, 2023

(65) Prior Publication Data

US 2023/0326718 A1    Oct. 12, 2023

Related U.S. Application Data (63) Continuation of application No. PCT/JP2021/045132, filed on Dec. 8, 2021.

(60) Provisional application No. 63/123,824, filed on Dec. 10, 2020.

(51) Int. Cl.
*H01L 21/311* (2006.01)
*H01J 37/32* (2006.01)

(52) U.S. Cl.
CPC .. *H01J 37/32146* (2013.01); *H01J 37/32128* (2013.01); *H01J 37/32449* (2013.01); *H01L 21/31116* (2013.01); *H01J 37/32091* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2020/0135458 A1* | 4/2020 | Mehrotra | H01L 21/3065 |
| 2021/0358716 A1* | 11/2021 | Kim | H01L 21/3065 |

FOREIGN PATENT DOCUMENTS

| | | |
|---|---|---|
| JP | 2009-187975 | 8/2009 |
| JP | 2014-022482 | 2/2014 |
| JP | 2020-507922 | 3/2020 |
| KR | 10-2020-0086622 | 7/2020 |
| WO | 2018/084186 | 5/2018 |
| WO | 2018/144198 | 8/2018 |
| WO | 2020/145051 | 7/2020 |

\* cited by examiner

*Primary Examiner* — Roberts P Culbert
(74) *Attorney, Agent, or Firm* — IPUSA, PLLC (57) ABSTRACT

A plasma processing method includes:
a) providing a substrate on a substrate support;
b) supplying a process gas;
c) periodically supplying a pulse voltage to the substrate support; and
d) periodically supplying RF power and generating plasma from the process gas to etch a silicon-containing film included in the substrate. The pulse voltage is negative. A first period in which a first pulse voltage is supplied and a second period in which the pulse voltage is not supplied or a second pulse voltage whose absolute value is less than that of the first pulse voltage is supplied are repeated in c). A third period in which first RF power is supplied and a fourth period in which the RF power is not supplied or second RF power less than the first RF power is supplied are repeated in d). The first period starts before a start of the third period.

18 Claims, 6 Drawing Sheets

PLASMA PROCESSING METHOD AND PLASMA PROCESSING APPARATUS

CROSS-REFERENCE TO RELATED APPLICATIONS

This application is a continuation application of International Application No. PCT/JP2021/045132 filed on Dec. 8, 2021, and designating the U.S., which is based upon and claims priority to U.S. Provisional Application No. 63/123,824, filed on Dec. 10, 2020, the entire contents of which are incorporated herein by reference.

BACKGROUND

1. Technical Field

The present disclosure relates to a plasma processing method and a plasma processing apparatus.

2. Description of the Related Art

A plasma processing apparatus is used to perform plasma processing on a substrate. The plasma processing apparatus includes a chamber and a substrate holding electrode. The substrate holding electrode is provided in the chamber. The substrate holding electrode holds the substrate mounted on the main surface of the substrate holding electrode. One type of such plasma processing apparatuses is described in, for example, Patent Document 1.

The plasma processing apparatus described in Patent Document 1 further includes a radio frequency generating device and a DC negative pulse generating device. The radio frequency generating device supplies a radio frequency voltage to the substrate holding electrode. In the plasma processing apparatus described in Patent Document 1, ON and OFF of the radio frequency voltage are alternately switched. Additionally, in the plasma processing apparatus described in Patent Document 1, a negative pulse voltage (DC) is supplied from the DC negative pulse generating device to the substrate holding electrode in accordance with the timings of ON and OFF of the radio frequency voltage.

RELATED ART DOCUMENT

Patent Document

[Patent Document 1] Japanese Laid-Open Patent Application Publication No. 2009-187975

SUMMARY

According to one embodiment of the present disclosure, a plasma processing method includes:
a) providing a substrate, including a silicon-containing film and a mask on the silicon-containing film, on a substrate support in a plasma processing chamber;
b) supplying a process gas into the plasma processing chamber;
c) periodically supplying a pulse voltage to the substrate support; and
d) periodically supplying RF power and generating plasma from the process gas by the RF power to etch the silicon-containing film. The pulse voltage has a negative polarity. A first period in which a first pulse voltage is supplied and a second period in which the pulse voltage is not supplied or a second pulse voltage whose absolute value is less than an absolute value of the first pulse voltage is supplied are repeated in c). A third period in which first RF power is supplied and a fourth period in which the RF power is not supplied or second RF power less than the first RF power is supplied are repeated in d). The first period starts before a start of the third period.

DETAILED DESCRIPTION

In the following, embodiments of the present disclosure will be described with reference to the drawings. In the drawings, the same components are denoted by the same reference numerals, and duplicated description may be omitted.

In the present specification, in directions such as parallel, perpendicular, orthogonal, horizontal, vertical, up-and-down, and left-and-right, deviations are allowed to such an extent that the effects of the embodiments are not impaired. A shape of a corner is not limited to a right angle and may be rounded in an arcuate shape. Parallel, perpendicular, orthogonal, horizontal, vertical, and circular may include substantially parallel, substantially perpendicular, substantially orthogonal, substantially horizontal, substantially vertical, and substantially circular.

[Film Structure of a Substrate]

Figure 1:
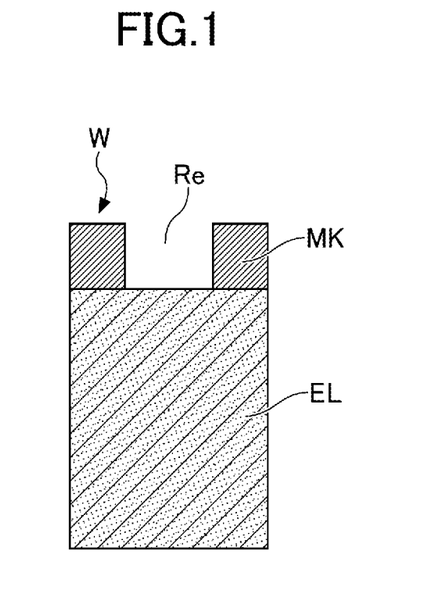
FIG. 1 is a schematic view of a film structure of a substrate processed according to one embodiment of the present disclosure.

FIG. 1 is a schematic view of a film structure on a substrate to be processed according to one embodiment of the present disclosure. A substrate W includes an etching target film EL and a mask MK on the etching target film EL. In the mask MK, a recess Re having a hole shape or a line shape is formed, and the etching target film EL is etched in the shape of the recess Re.

The etching target film EL may be, for example, a silicon-containing film. The silicon-containing film may be a silicon oxide film, a silicon nitride film, a silicon germanium film, a silicon carbide film, or a stacked film including two or more of these films. However, the silicon-containing film is preferably a silicon oxide film or a stacked film of a silicon oxide film and a silicon nitride film.

Additionally, the mask MK may be a polysilicon film, a boron-doped silicon film, an organic film, or a tungsten-containing film. The tungsten-containing film may be a tungsten silicide film or a tungsten boron carbide film.

[Plasma Processing Method]

In one aspect of the present disclosure, the etching target film EL is selectively etched with respect to the mask MK by a plasma processing method for the substrate W. The etching target film EL may be, for example, a silicon-containing film. The mask MK is disposed on the silicon-containing film, for example. The method includes the following steps (a) to (d):
  (a) providing a substrate on a substrate support in a plasma processing chamber, the substrate including a silicon-containing film and a mask on the silicon-containing film;
  (b) supplying a process gas into the plasma processing chamber;
  (c) periodically supplying a negative pulse voltage to the substrate support; and
  (d) periodically supplying a radio frequency (RF) power and generating plasma from the process gas by the RF power to etch the silicon-containing film.

(a: Step of Providing the Substrate)

In the step (a) of providing the substrate, as an example of the substrate, the substrate W having a film structure as illustrated in FIG. 1 is provided on a substrate support 11 (see FIG. 6) disposed in a plasma processing chamber 10 of a plasma processing apparatus 1, which will be described later.

(b: Step of Supplying the Process Gas)

In the step (b) of supplying the process gas, the process gas is supplied into the plasma processing chamber from a showerhead 13 (see FIG. 6), which will be described later.

Figure 2:
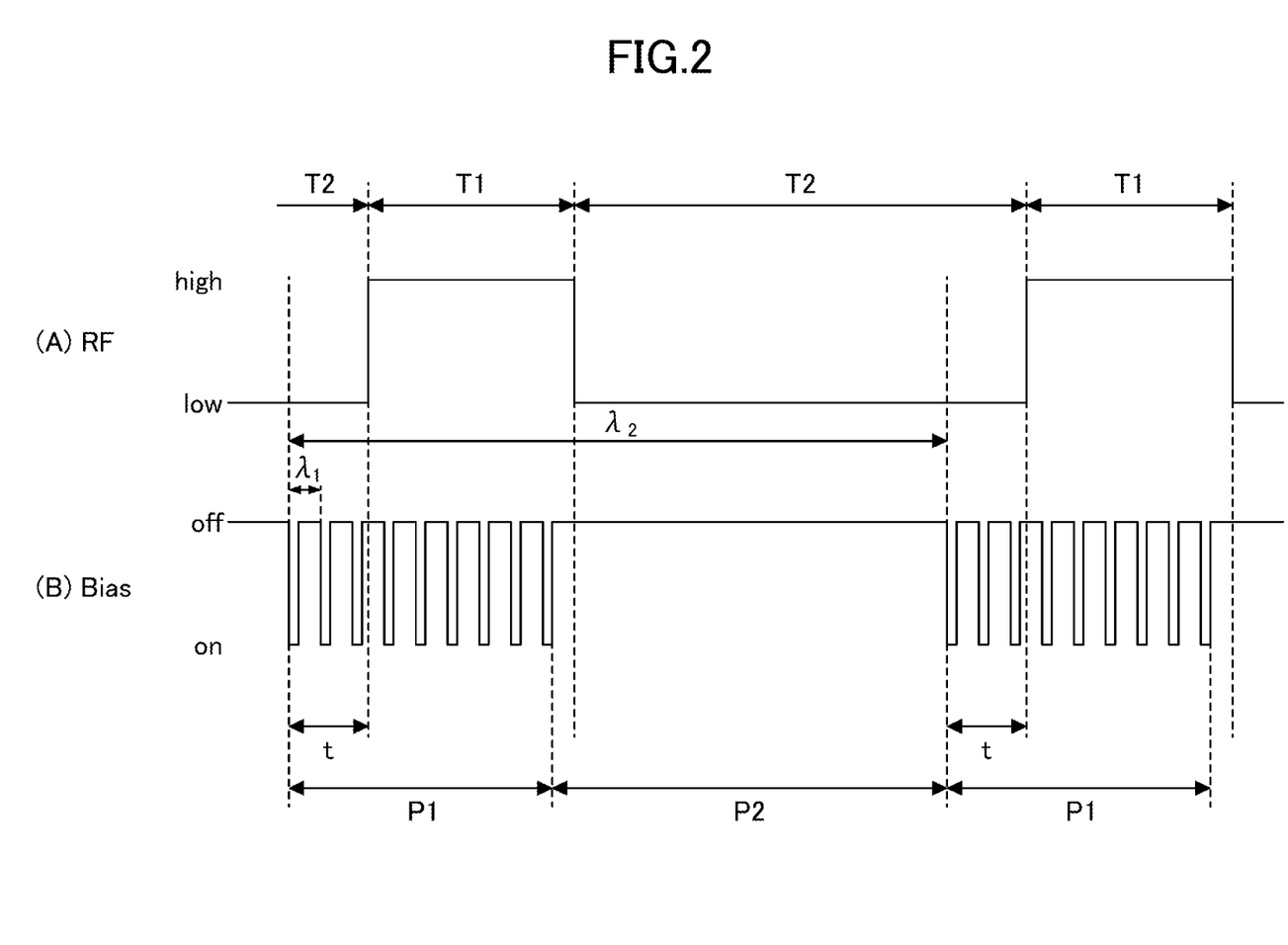
FIG. 2 is a time chart illustrating timings of supplying RF power and timings of supplying a bias voltage (a negative pulse voltage) in a plasma processing method according to one embodiment of the present disclosure.

FIG. 2 is a time chart illustrating an example of timings of supplying (A) RF power and (B) a bias voltage in a plasma processing method according to one embodiment of the present disclosure. In the embodiment of the present disclosure, in the state where the substrate W is provided, (B) the bias voltage is supplied as illustrated in FIG. 2 in the step (c), and (A) the RF power is supplied in the step (d).

(c: Step of Supplying the Negative Pulse Voltage)

In the step (c) of supplying the negative pulse voltage, the negative pulse voltage (a pulse voltage having a negative polarity) (hereinafter, also referred to as a "bias voltage") is periodically supplied to a bias electrode of the substrate support 11. The "periodically" here indicates both the periodicity of ON and OFF in a first period P1, which will be described later, and the periodicity of the ON state of the pulse wave in the first period P1 and the OFF state in a second period P2. The bias electrode may be a lower electrode (a base 1110, see FIG. 6) that supports the substrate support 11, or may be an electrode 1112b (see FIG. 6) disposed in the substrate support 11. The substrate support 11 may be, for example, an electrostatic chuck 1111 (see FIG. 6).

In FIG. 2 (B), the bias voltage repeats the first period P1 in which the negative pulse voltage is supplied and the second period P2 in which the supply of the negative pulse voltage is stopped in this order corresponding to the timings of "high" and "low" of the radio frequency power illustrated in FIG. 2 (A), for example. Additionally, a duration in which the radio frequency power is "high" is set as a third period T1, a duration in which the radio frequency power is "low" is set as a fourth period T2, and the supply of the bias voltage is started before the start of the third period T1 (a time t before). The supply of the negative pulse voltage is stopped at the end or before the end of the third period T1. Here, the third period T1 is a duration in which first RF power is supplied, and the fourth period T2 is a duration in which the RF power is not supplied or second RF power smaller than the first RF power is supplied. The first period P1 in which the negative pulse voltage is supplied is an example of a first period in which a first pulse voltage is supplied. The second period P2 in which the supply of the negative pulse voltage is stopped is an example of a second period in which no pulse voltage is supplied or a second pulse voltage whose absolute value is smaller than that of the first pulse voltage is supplied. As will be described later, in the second period, no pulse voltage may be supplied or the second pulse voltage smaller than the first pulse voltage may be supplied.

In the first period P1 in which the negative pulse voltage is supplied, the bias voltage periodically repeats an on-state (on: a negative value) and an off-state (off: 0 V). In the second period P2, the bias voltage is in an off state. The on state of the bias voltage indicates that the bias voltage is supplied to the bias electrode. Conversely, the off state of the bias voltage indicates that the bias voltage is not supplied to the bias electrode (the bias voltage is 0 V).

In the first period P1 in which the negative pulse voltage is supplied, when a first frequency $f_1$ is a reciprocal of the on/off period (a wavelength $\lambda_1$) of the negative pulse voltage supplied to the bias electrode, the first frequency $f_1$ of the bias voltage may be 100 kHz or greater and 3.2 MHz or less. The first frequency $f_1$ is set to, for example, 400 kHz.

Additionally, in the first period P1, the duty ratio of the bias voltage at the first frequency $f_1$ is referred to as a first duty ratio. The first duty ratio indicates a ratio of the ON time of the pulse voltage, and is a ratio of the ON time to the total time of the ON time and the OFF time of the bias voltage in the first period P1 (the ON time/(the ON time+the OFF time)). The first duty ratio may be 30% or less, or may be 20% or less. The negative pulse voltage may have a pulse waveform of a rectangular wave, a triangular wave, an impulse wave, a trapezoidal wave, or a combination thereof.

In one embodiment of the present disclosure, the first period P1 in which the negative pulse voltage is supplied and the second period P2 in which the supply is stopped are periodically repeated. When a second frequency $f_2$ is a reciprocal of the period (a wavelength $\lambda_2$) of the first period P1 and the second period P2, the second frequency $f_2$ of the bias voltage may be 0.1 KHz or greater and 20 kHz or less. Additionally, when a duty ratio of the pulse waveform of the bias voltage at the second frequency $f_2$ is defined as a second duty ratio, the second duty ratio may be 40% or less. The second duty ratio indicates a ratio of the first period, and is a ratio of the first period P1 to the total time (the first period P1+the second period P2). Here, an absolute value of the amplitude of the negative pulse voltage may be 0.5 kV or greater and 20 kV or less.

(d: Step of Etching the Substrate)

In the step (d) of etching the silicon-containing film formed on the substrate W, the silicon-containing film formed on the substrate W is etched using plasma generated from the process gas by the RF power. The RF power is supplied to the substrate support 11. However, the RF power may be supplied to the showerhead 13 facing the substrate support 11.

The frequency of the RF power may be in a range of 27 MHz to 100 MHz, and may be, for example, 40 MHz or 60 MHz. The process gas is selected according to the type of the etching target film EL. When the etching target film EL is a silicon oxide film, a fluorine-containing gas may be used as the process gas, for example. The fluorine-containing gas may be, for example, a fluorocarbon gas or a nitrogen trifluoride gas. Further, an oxygen-containing gas, an inert gas, or both may be added to the process gas.

In FIG. 2 (A), "low" indicates that the RF power is not supplied (the RF power is 0 W) or the magnitude of the RF power is the first RF power greater than 0 W. The first RF power may be, for example, less than 1 kW, may be 500 W or less, or may be 50 W or less. With respect to the above, "high" indicates that the magnitude of the RF power is the second RF power greater than the first RF power. The second RF power may be, for example, 1 kW or greater and 10 kW or less.

In the step (d) of etching, the third period T1 in which the RF power is controlled to be "high" and the fourth period T2 in which the RF power is controlled to be "low" are repeated in this order. The supply of the RF power generates plasma from the process gas to etch the silicon-containing film EL formed on the substrate W.

In the step (c) of supplying the negative pulse voltage, the supply of the bias voltage is started a time t before the start of the third period T1. The time t may be 1 μsec or greater and 20 μsec or less. At this time, the first period P1 starts 1 μsec or greater and 20 μsec or less before the start of the third period T1. The time t is more preferably 3 μsec or greater and 14 μsec or less. At this time, the first period P1 starts 3 μsec or greater and 14 μsec or less before the start of the third period T1. The time t is particularly preferably 5 μsec or greater and 10 μsec or less. At this time, the first period P1 starts 5 μsec or greater and 10 μsec or less before the start of the third period T1.

In the step (c), when one ON state waveform included in a wavelength $\lambda_1$ of the pulse voltage is defined as one waveform, the number of waves of the pulse voltage included in the time t, that is, the duration from the start of the first period P1 to the start of the third period T1 may be one waveform or more and six waveforms or less. As an example, in FIG. 2, the number of waves of the pulse voltage included in the time t is 3, and in FIG. 3 described later, the number of waves of the pulse voltage included in the time t is 6.

According to the plasma processing method of one embodiment of the present disclosure, the etching rate can be improved by controlling to start the supply of the bias voltage the time t before the start of the third period T1. Additionally, the etching selectivity defined as the ratio (Ve/Vm) of the etching rate Ve of the silicon-containing film of the etching target film EL to the etching rate Vm of the mask MK can be improved by 40% or more. Next, an evaluation experiment indicating the above effects will be described.

EXAMPLES

Figure 3:
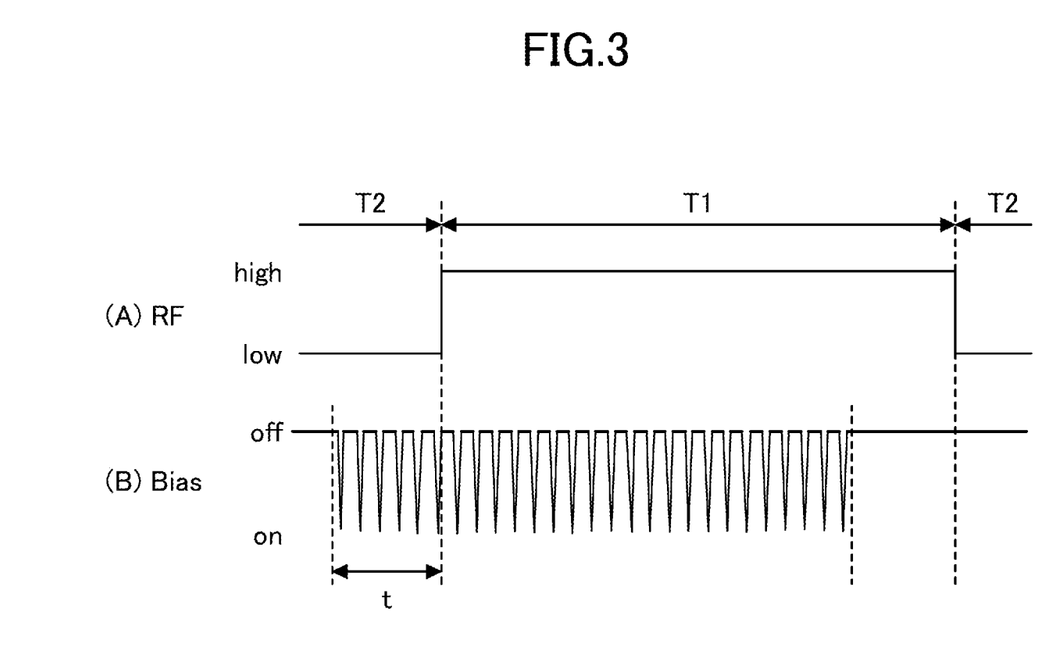
FIG. 3 is a time chart illustrating an example of timings of supplying the RF power and the bias voltage in an example of the plasma processing method according to one embodiment of the present disclosure.
Figure 4:
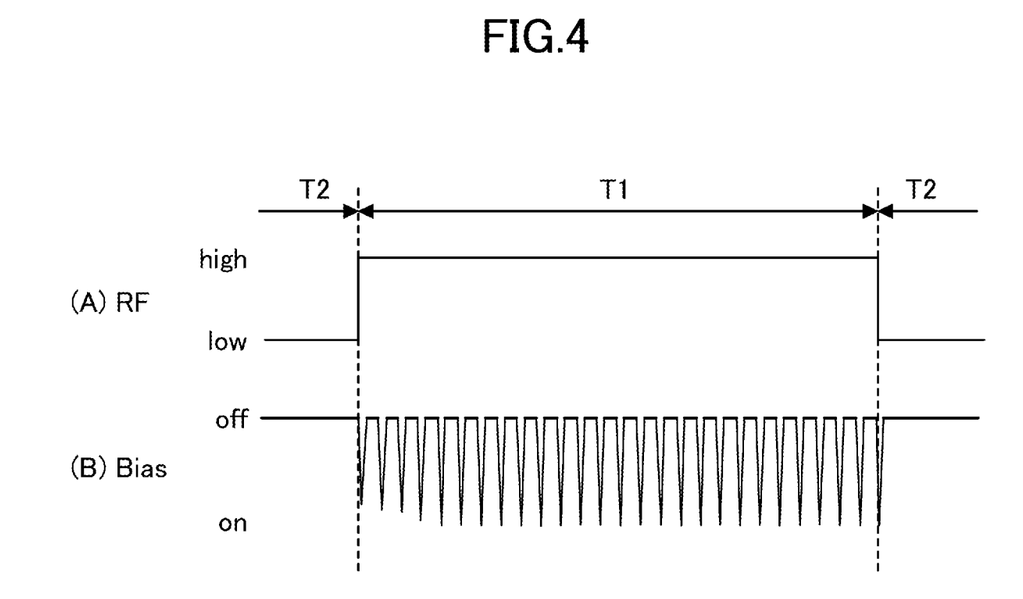
FIG. 4 is a time chart illustrating timings of supplying the RF power and the bias voltage in a plasma processing method according to a reference example.

An example of the plasma processing method according to the embodiment of the present disclosure described above will be described in comparison with a reference example. FIG. 3 is a time chart illustrating timings of supplying (A) the RF power and (B) the bias voltage in the example of the plasma processing method according to the embodiment of the present disclosure. FIG. 4 is a time chart illustrating timings of supplying (A) the RF power and (B) the bias voltage in a plasma processing method of the reference example.

In this evaluation experiment, the substrate W as illustrated in FIG. 1 was used. In the substrate W specifically used in each of the example and the reference example, the etching target film EL is formed of a silicon oxide film, and the mask MK is formed of a polysilicon film.

Additionally, in each of the example and the reference example, the processing conditions in the evaluation experiment were identical, and the plasma processing was performed on the substrate W under the following processing conditions.

<Processing Conditions in the Evaluation Experiment>
 the pressure in the plasma processing chamber: 10 mTorr (1.33 Pa)
 the process gas: $C_4F_6$ gas, $C_4F_8$ gas, $NF_3$ gas, $O_2$ gas
 the RF power: 40 MHz, high: 5.5 kW, low: 0 kW
 the negative pulse voltage: −8.0 kV, the pulse wave (the triangular wave)
 the first frequency $f_1$: 400 kHz, the first duty ratio: 17%
 the second frequency $f_2$: 3 kHz, the second duty ratio: 20%
 the time t: 14 μsec In the plasma processing method of the example illustrated in FIG. 3, the negative pulse voltage was supplied to the bias electrode a time t before the start of the third period T1, and in the plasma processing method of the reference example illustrated in FIG. 4, the same process was performed except that the negative pulse voltage was supplied to the bias electrode at the same time as the start of the third period T1.

As a result of the experiment, when the plasma processing method of the reference example was performed, the etching rate of the silicon oxide film was 80 nm/min and the etching selectivity was 1.7. When the plasma processing method of the example was performed, the etching rate of the silicon oxide film was 110 nm/min and the etching selectivity was 2.4. As described above, according to the plasma processing method of the example, the etching rate and the etching selectivity can be improved by 40% or more in comparison with the plasma processing method of the reference example.

In each of the plasma processing methods of the example of FIG. 3 and the reference example of FIG. 4, the negative pulse voltage is supplied to the bias electrode when the RF power is in a high state in the third period T1. Ions in the plasma generated at the timing when the pulse voltage is off are attracted to the substrate W by the negative voltage supplied to the bias electrode at the timing when the pulse voltage is on, thereby facilitating the etching.

In the plasma processing method of the reference example, the supply of the negative pulse power to the bias electrode was started simultaneously with the start of the third period T1. At this time, as illustrated in FIG. 4, a decrease in the amplitude was found in the negative pulse power immediately after the supply.

In the plasma processing method of the example, as illustrated in FIG. 3, by starting the supply of the negative pulse voltage a time t before the start of the third period T1, a decrease in the amplitude of the negative pulse power immediately after the supply can be prevented. Therefore, it is conceivable that in the plasma processing method of the example, the plasma was more stable than that in the plasma processing method of the reference example, thereby improving the etching rate and further facilitating the etching. Additionally, it is conceivable that the stabilization of the plasma suppresses the peeling of the mask MK in the fourth period T2, thereby improving the etching selectivity.

Although the negative pulse voltage is used as an example in the above description, the present invention is not limited to this. In one embodiment, the pulse voltage may be a voltage generated by waveform shaping using a waveform shaper with respect to a direct-current voltage generated by a DC power supply 32 (see FIG. 6) described later. The pulse voltage may have a pulse waveform of a rectangular wave, a triangular wave, an impulse wave, a trapezoidal wave, a suitably selected waveform, or a combination thereof. The pulse voltage is periodically supplied to the substrate support 11. The polarity of the pulse voltage may be negative or positive as long as the potential of the substrate W is set to cause a potential difference between the plasma and the substrate W so that ions are attracted to the substrate W.

With respect to the above description, the following items are further disclosed.

A plasma processing method includes:
  a) providing a substrate on a substrate support in a plasma processing chamber, the substrate including a silicon-containing film and a mask on the silicon-containing film;
  b) supplying a process gas into the plasma processing chamber;
  c) periodically supplying a pulse voltage to the substrate support; and
  d) periodically supplying RF power and generating plasma from the process gas by the RF power to etch the silicon-containing film. The pulse voltage is supplied to the substrate support to generate a potential difference between the plasma and the substrate, a first period in which a first pulse voltage is supplied and a second period in which the pulse voltage is not supplied or a second pulse voltage less than the first pulse voltage is supplied are repeated in c), a third period in which first RF power is supplied and a fourth period in which the RF power is not supplied or second RF power less than the first RF power is supplied are repeated in d), and the first period starts before a start of the third period.

[Plasma Processing System]

Figure 5:
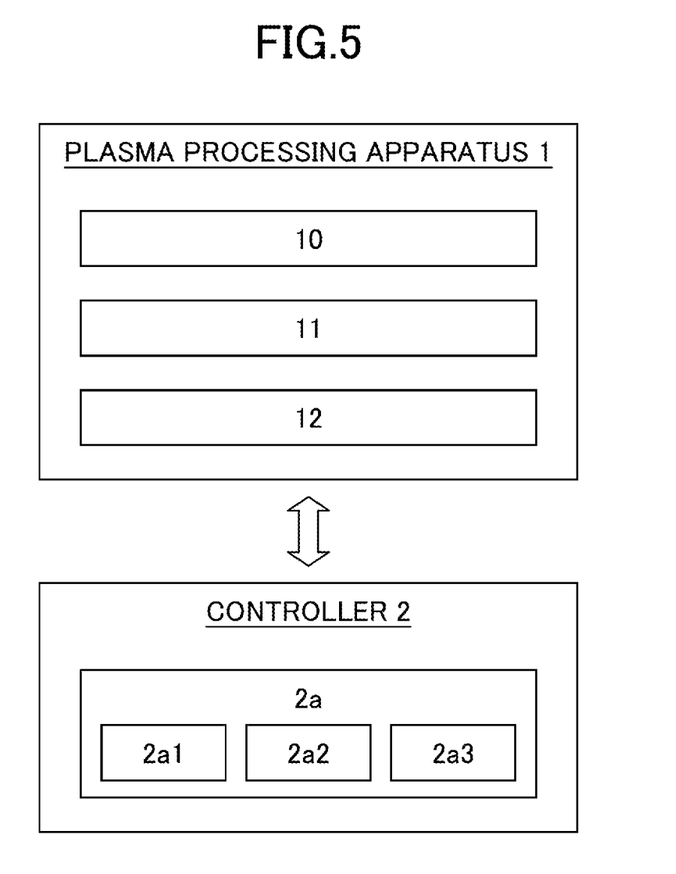
FIG. 5 is a diagram for depicting a configuration example of a plasma processing system.

Next, an example of a plasma processing system and a plasma processing apparatus that can perform the plasma processing method according to the embodiment of the present disclosure will be described. FIG. 5 is a diagram for depicting a configuration example of the plasma processing system.

As illustrated in FIG. 5, in one embodiment, the plasma processing system includes the plasma processing apparatus 1 and a controller 2. The plasma processing system is an example of a substrate processing system, and the plasma processing apparatus 1 is an example of a substrate processing apparatus. The plasma processing apparatus 1 includes the plasma processing chamber 10, the substrate support 11, and a plasma generator 12. The plasma processing chamber 10 has a plasma processing space 10s (see FIG. 6). Additionally, the plasma processing chamber 10 has at least one gas supply port 13a (see FIG. 6) for supplying at least one process gas into the plasma processing space 10s, and at least one gas exhaust port 10e (see FIG. 6) for exhausting a gas from the plasma processing space 10s. The gas supply port 13a is connected to a gas supply 20 described later, and the gas exhaust port 10e is connected to an exhaust system 40 described later. The substrate support 11 is disposed in the plasma processing space 10s and has a substrate support surface for supporting the substrate W (see FIG. 6).

The plasma generator 12 is configured to generate plasma from at least one process gas supplied into the plasma processing space 10s. The plasma formed in the plasma processing space 10s may be capacitively coupled plasma (CCP), inductively coupled plasma (ICP), electron-cyclotron-resonance plasma (ECR plasma), helicon wave plasma (HWP), surface wave plasma (SWP), or the like. Additionally, various types of plasma generators may be used, including an alternating current (AC) plasma generator and a direct current (DC) plasma generator. In one embodiment, the AC signal (AC power) used in the AC plasma generator has a frequency within a range of 100 kHz to 10 GHz. Thus, the AC signal includes a radio frequency (RF) signal and a microwave signal. In one embodiment, the RF signal has a frequency within a range of 100 kHz to 150 MHz.

The controller 2 processes computer-executable instructions that cause the plasma processing apparatus 1 to perform various steps described in the present disclosure. The controller 2 may be configured to control respective elements of the plasma processing apparatus 1 to perform various processes described herein. In one embodiment, part or an entirety of the controller 2 may be included in the plasma processing apparatus 1. The controller 2 may include a processor 2a1, a storage unit 2a2, and a communication interface 2a3. The controller 2 is implemented by, for example, a computer 2a. The processor 2a1 may be configured to read a program from the storage unit 2a2 and execute the read program to perform various control operations. This program may be stored in the storage unit 2a2 in advance, or may be acquired via a medium when necessary. The acquired program is stored in the storage unit 2a2, and is read from the storage unit 2a2 and executed by the processor 2a1. The medium may be various storage media readable by the computer 2a, or may be a communication line connected to the communication interface 2a3. The processor 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 6:
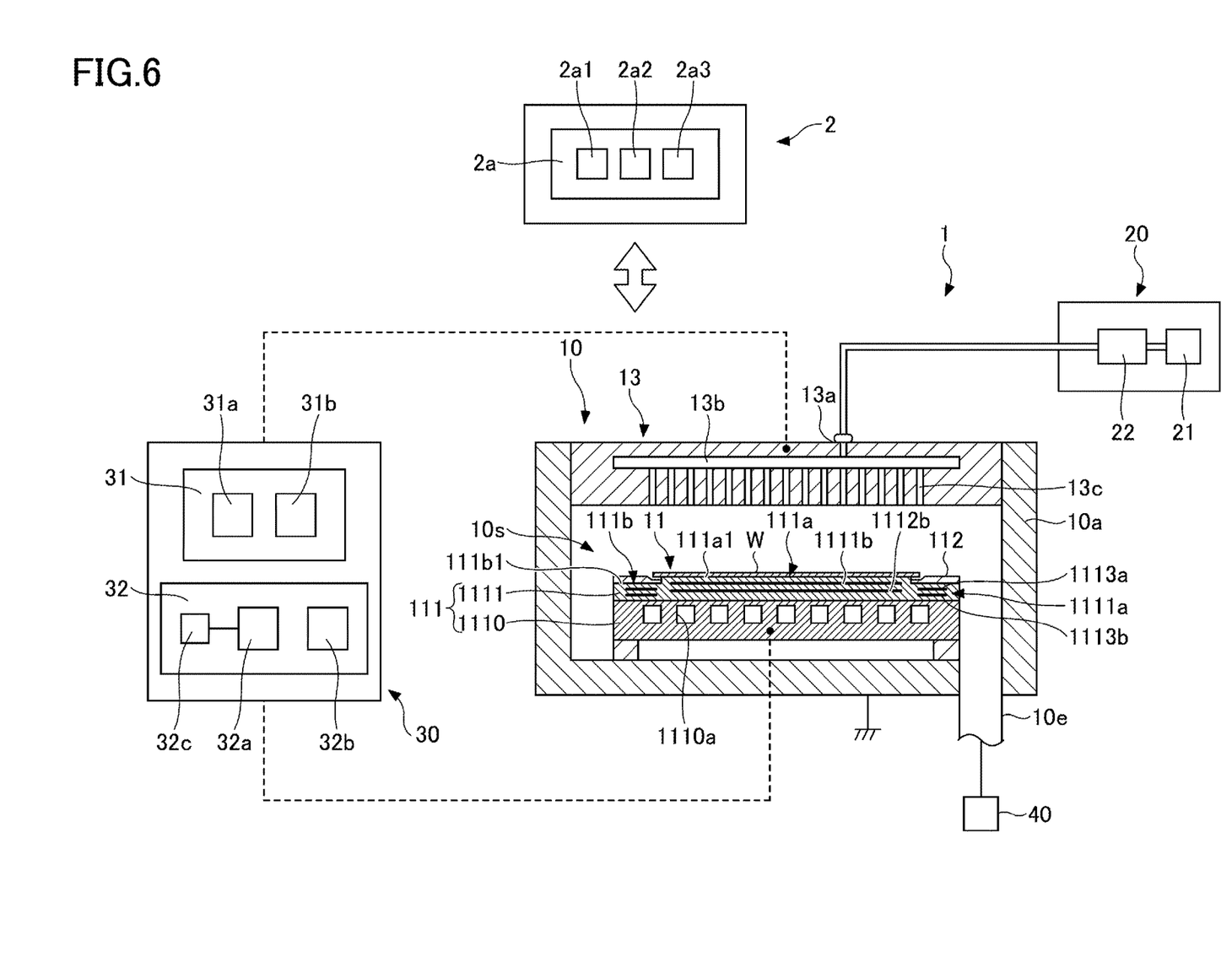
FIG. 6 is a diagram for depicting a configuration example of a capacitively coupled plasma processing apparatus.

In the following, a configuration example of a capacitively coupled plasma processing apparatus will be described as an example of the plasma processing apparatus 1. FIG. 6 is a diagram for depicting the configuration example of the capacitively coupled plasma processing apparatus.

The capacitively coupled plasma processing apparatus 1 includes the plasma processing chamber 10, the gas supply 20, a power supply 30, and the exhaust system 40. The plasma processing apparatus 1 further includes the substrate support 11 and a gas introduction section. The gas introduction section is configured to introduce at least one process gas into the plasma processing chamber 10. The gas introduction section includes the showerhead 13. The substrate support 11 is disposed in the plasma processing chamber 10. The showerhead 13 is disposed above the substrate support 11. In one embodiment, the showerhead 13 forms at least a portion of a ceiling of the plasma processing chamber 10. The plasma processing chamber 10 has the plasma processing space 10s defined by the showerhead 13, sidewalls 10a of the plasma processing chamber 10, and the substrate support 11. The plasma processing chamber 10 is grounded. The showerhead 13 and the substrate support 11 are electrically insulated from a housing of the plasma processing chamber 10.

The substrate support 11 includes a body 111 and a ring assembly 112. The body 111 has a central region 111a for supporting the substrate W and an annular region 111b for supporting the ring assembly 112. The substrate W is an example of a substrate, and a wafer is an example of the substrate W. The annular region 111b of the body 111 surrounds the central region 111a of the body 111 in a plan view. The substrate W is disposed on the central region 111a of the body 111, and the ring assembly 112 is disposed on the annular region 111b of the body 111 so as to surround the substrate W disposed on the central region 111a of the body 111. Thus, the central region 111a is also referred to as a substrate support surface for supporting the substrate W and the annular region 111b is also referred to as a ring support surface for supporting the ring assembly 112.

In one embodiment, the body 111 includes the base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111a and an electrostatic electrode 1111b disposed within the ceramic member 1111a in the central region 111a. The ceramic member 1111a has the central region 111a. In one embodiment, the ceramic member 1111a also has the annular region 111b. Here, another member surrounding the electrostatic chuck 1111 such as an annular electrostatic chuck or an annular insulating member may have the annular region 111b. In this case, the ring assembly 112 may be disposed on the annular electrostatic chuck or the annular insulating member, or may be disposed on both the electrostatic chuck 1111 and the annular insulating member. Additionally, at least one RF/DC electrode coupled to a RF power supply 31, a DC power supply 32, or both described later may be disposed within the ceramic member 1111a. In this case, the at least one RF/DC electrode functions as a lower electrode. When a bias RF signal, a DC signal, or both described later are supplied to the at least one RF/DC electrode, the RF/DC electrode is also referred to as a bias electrode. The electrode 1112b disposed parallel to the electrostatic electrode 1111b is embedded in the electrostatic chuck 1111 below the electrostatic electrode 1111b. The electrode 1112b is an example of a bias electrode. Here, the conductive member of the base 1110 and the at least one RF/DC electrode may function as multiple lower electrodes. The electrostatic electrode 1111b may function as a lower electrode. Thus, the substrate support 11 includes at least one lower electrode.

The ring assembly 112 includes one or more annular members. In one embodiment, the one or more annular members include one or more edge rings and at least one cover ring. The edge ring is formed of a conductive material or an insulating material, and the cover ring is formed of an insulating material.

Additionally, the substrate support 11 may include a temperature control module configured to control at least one of the electrostatic chuck 1111, the ring assembly 112, and the substrate to a target temperature. The temperature control module may include a heater, a heat transfer media, a flow path 1110a, or a combination thereof. Through the flow path 1110a, a heat transfer fluid, such as brine or a gas, flows. In one embodiment, the flow path 1110a is formed in the base 1110 and one or more heaters are disposed within the ceramic member 1111a of the electrostatic chuck 1111. Additionally, the substrate support 11 may include a heat transfer gas supply configured to supply a heat transfer gas to a gap between the back surface of the substrate W and the central region 111a.

In one embodiment, the ceramic member 1111a has the annular region 111b. The electrostatic chuck 1111 may include the ceramic member 1111a and an electrostatic electrode 1113a disposed within the ceramic member 1111a in the annular region 111b. An electrode 1113b disposed parallel to the electrostatic electrode 1113a may be provided below the electrostatic electrode 1113a. The electrode 1113b is an example of a bias electrode.

The showerhead 13 is configured to introduce at least one process gas from the gas supply 20 into the plasma processing space 10s. The showerhead 13 includes at least one gas supply port 13a, at least one gas diffusion chamber 13b, and multiple gas introduction ports 13c. The process gas supplied to the gas supply port 13a passes through the gas diffusing chamber 13b and is introduced into the plasma processing space 10s from the multiple gas introduction ports 13c. Additionally, the showerhead 13 includes at least one upper electrode. Here, the gas introduction section may include, in addition to the showerhead 13, one or more side gas injectors (SGIs) attached to one or more openings formed in the sidewall 10a.

The gas supply 20 may include at least one gas source 21 and at least one flow rate controller 22. In one embodiment, the gas supply 20 is configured to supply at least one process gas from a corresponding gas source 21 to the showerhead 13 via a corresponding flow rate controller 22. Each flow rate controller 22 may include, for example, a mass flow controller or a pressure control type flow rate controller. Further, the gas supply 20 may include at least one flow modulation device to modulate or pulse the flow rate of the at least one process gas.

The power supply 30 includes the RF power supply 31 coupled to the plasma processing chamber 10 via at least one impedance matching circuit. The RF power supply 31 is configured to supply at least one RF signal (RF power) to the at least one lower electrode, the at least one upper electrode, or both. This forms plasma from the at least one process gas supplied into the plasma processing space 10s. Therefore, the RF power supply 31 may function as at least part of the plasma generator 12. Additionally, by supplying the bias RF signal to the at least one lower electrode, a bias potential is generated in the substrate W, and ion components in the formed plasma can be attracted to the substrate W.

In one embodiment, the RF power supply 31 includes a first RF generator 31a and a second RF generator 31b. The first RF generator 31a is coupled to the at least one lower electrode, the at least one upper electrode, or both via at least one impedance matching circuit and is configured to generate a source RF signal (source RF power) for plasma generation. In one embodiment, the source RF signal has a frequency in a range of 10 MHz to 150 MHz. In one embodiment, the first RF generator 31a may be configured to generate multiple source RF signals having different frequencies. The generated one or more source RF signals are supplied to the at least one lower electrode, the at least one upper electrode, or both.

The second RF generator 31b is coupled to the at least one lower electrode via at least one impedance matching circuit and is configured to generate a bias RF signal (bias RF power). The frequency of the bias RF signal may be identical to or different from the frequency of the source RF signal. In one embodiment, the bias RF signal has a frequency that is lower than the frequency of the source RF signal. In one embodiment, the bias RF signal has a frequency in a range 100 kHz to 60 MHz. In one embodiment, the second RF generator 31b may be configured to generate multiple bias RF-signals having different frequencies. The generated one or more bias RF signals are supplied to the at least one lower electrode. Additionally, in various embodiments, the source RF signal provides (A) the RF power, which is illustrated in FIG. 2 and FIG. 3 as examples.

Additionally, the power supply 30 may include the DC power supply 32 coupled to the plasma processing chamber 10. The DC power supply 32 includes a first DC generator 32a and a second DC generator 32b. In one embodiment, the first DC generator 32a is connected to the at least one lower electrode and is configured to generate a first DC signal. The generated first DC signal is supplied to the at least one lower electrode. In one embodiment, the second DC generator 32b is connected to the at least one upper electrode and is configured to generate a second DC signal. The generated second DC signal is supplied to the at least one upper electrode.

In various embodiments, the first DC signal is pulsed. The first DC signal provides (B) the bias voltage, which is illustrated in FIG. 2 and FIG. 3 as an example. The second DC signal may be pulsed. In this case, a sequence of the pulse voltage is supplied to the at least one lower electrode, the at least one upper electrode, or both. In one embodiment, a waveform shaper 32c for generating the sequence of the pulse voltage from the DC signal is connected between the first DC generator 32a and the at least one lower electrode. Therefore, the first DC generator 32a and the waveform shaper 32c constitute a voltage-pulse generator. The pulse voltage is a voltage generated by waveform shaping using the waveform shaper 32c with respect to the direct-current voltage generated by the first DC generator 32a. The pulse voltage may have a pulse waveform of a rectangular wave, a triangular wave, an impulse wave, a trapezoidal wave, or a combination thereof. The pulse voltage need not be a negative direct-current voltage as long as the pulse voltage is supplied to the substrate support 11 to generate a potential difference between the plasma and the substrate W. That is, the pulse voltage shaped by the waveform shaper 32c may be negative or positive as long as the potential of the substrate W is set to cause a potential difference between the plasma and the substrate W so that ions are attracted to the substrate W.

When the second DC generator 32b and the waveform shaper constitute the voltage-pulse generator, the voltage-pulse generator is connected to the at least one upper electrode. The voltage pulse may have a positive polarity or may have a negative polarity. The sequence of voltage pulses may include one or more positive voltage pulses and one or more negative voltage pulses in one period. Here, the first and second DC generators 32a and 32b may be provided in addition to the RF power supply 31, or the first DC generator 32a may be provided instead of the second RF generator 31b. In the present embodiment, the first DC generator 32a is provided instead of the second RF generator 31b.

The exhaust system 40 may be connected to the gas exhaust port 10e provided at the bottom of the plasma processing chamber 10, for example. The exhaust system 40 may include a pressure control valve and a vacuum pump. The pressure inside the plasma processing space 10s is controlled by the pressure control valve. The vacuum pump may include a turbo-molecular pump, a dry pump, or a combination thereof.

As described above, according to the plasma processing method and the plasma processing apparatus of the present embodiment, the etching selectivity can be improved. Additionally, the etching rate can be improved.

It should be understood that the plasma processing method and the plasma processing apparatus according to the embodiments disclosed herein are illustrative in all respects and are not restrictive. The embodiments can be modified and improved in various forms without departing from the scope and spirit of the appended claims. The matters described in the multiple embodiments can also take other configurations as long as there is no contradiction, and can be combined as long as there is no contradiction.

According to one aspect, the etching selectivity can be improved in plasma processing for a substrate.

What is claimed is:

1. A plasma processing method comprising:
  a) providing a substrate on a substrate support in a plasma processing chamber, the substrate including a silicon-containing film and a mask on the silicon-containing film;
  b) supplying a process gas into the plasma processing chamber;
  c) periodically supplying a pulse voltage to the substrate support; and
  d) periodically supplying radio frequency (RF) power and generating plasma from the process gas by the RF power to etch the silicon-containing film,
  wherein the pulse voltage has a negative polarity,
  wherein a first period in which a first pulse voltage is supplied and a second period in which the pulse voltage is not supplied or a second pulse voltage whose absolute value is less than an absolute value of the first pulse voltage is supplied are repeated in c),
  wherein a third period in which first RF power is supplied and a fourth period in which the RF power is not supplied or second RF power less than the first RF power is supplied are repeated in d), and
  wherein the first period starts before a start of the third period.

2. The plasma processing method as claimed in claim 1, wherein the absolute value of the pulse voltage supplied to the substrate support in c) is 0.5 kV or greater and 20 kV or less.

3. A plasma processing method comprising:
  a) providing a substrate on a substrate support in a plasma processing chamber, the substrate including a silicon-containing film and a mask on the silicon-containing film;
  b) supplying a process gas into the plasma processing chamber;
  c) periodically supplying a pulse voltage to the substrate support; and
  d) periodically supplying RF power and generating plasma from the process gas by the RF power to etch the silicon-containing film,
  wherein the pulse voltage is supplied to the substrate support to generate a potential difference between the plasma and the substrate,
  wherein a first period in which a first pulse voltage is supplied and a second period in which the pulse voltage is not supplied or a second pulse voltage less than the first pulse voltage is supplied are repeated in c),
  wherein a third period in which first RF power is supplied and a fourth period in which the RF power is not supplied or second RF power less than the first RF power is supplied are repeated in d), and
  wherein the first period starts before a start of the third period.

4. The plasma processing method as claimed in claim 1, wherein c) includes performing waveform shaping on a direct-current voltage to obtain a direct-current pulse voltage and supplying the obtained direct-current pulse voltage to the substrate support as the pulse voltage.

5. The plasma processing method as claimed in claim 1, wherein the first period starts 1 μsec or greater and 20 μsec or less before the start of the third period.

6. The plasma processing method as claimed in claim 5, wherein the first period starts 3 μsec or greater and 14 μsec or less before the start of the third period.

7. The plasma processing method as claimed in claim 6, wherein the first period starts 5 μsec or greater and 10 μsec or less before the start of the third period.

8. The plasma processing method as claimed in claim 1, wherein a number of waves of the pulse voltage included in a duration from a start of the first period to the start of the third period is 1 or greater and 6 or less.

9. The plasma processing method as claimed in claim 1, wherein a first frequency is 100 kHz or greater and 3.2 MHz or less, the first frequency being a reciprocal of a period in which the pulse voltage becomes ON and OFF in the first period.

10. The plasma processing method as claimed in claim 9, wherein a first duty ratio is 30% or less, the first duty ratio being a ratio of ON time of the pulse voltage in the first period.

11. The plasma processing method as claimed in claim 10, wherein the first duty ratio is 20% or less.

12. The plasma processing method as claimed in claim 1, wherein a second frequency is 0.1 kHz or greater and 20 kHz or less, the second frequency being a reciprocal of a period of the first period and the second period in c).

13. The plasma processing method as claimed in claim 12, wherein a second duty ratio is 40% or less, the second duty ratio being a ratio of the first period in c).

14. The plasma processing method as claimed in claim 1, wherein the pulse voltage has a pulse waveform of a rectangular wave, a triangular wave, an impulse wave, a trapezoidal wave, or a combination thereof.

15. The plasma processing method as claimed in claim 1, wherein the silicon-containing film is a silicon oxide film, a silicon nitride film, a silicon germanium film, a silicon carbide film, or a stacked film including two or more thereof.

16. The plasma processing method as claimed in claim 15, wherein the silicon-containing film is the silicon oxide film or a stacked film of the silicon oxide film and the silicon nitride film.

17. The plasma processing method as claimed in claim 1, wherein the mask is a polysilicon film, a boron-doped silicon film, an organic film, or a tungsten-containing film.

18. The plasma processing method as claimed in claim 17, wherein the tungsten-containing film is a tungsten silicide film or a tungsten boron carbide film.

* * * * *